US012813119B2

(12) United States Patent
Weaver et al.

(10) Patent No.: US 12,813,119 B2
(45) Date of Patent: Nov. 24, 2026

(54) ORGANIC ELECTROLUMINESCENT DEVICES

(71) Applicant: Universal Display Corporation, Ewing, NJ (US)

(72) Inventors: Michael Stuart Weaver, Princeton, NJ (US); Lorne A. Whitehead, Vancouver (CA); Eric A. Margulies, Philadelphia, PA (US); Michael Hack, Carmel, CA (US)

(73) Assignee: Universal Display Corporation, Ewing, NJ (US)

( * ) Notice: Subject to any disclaimer, the term of this patent is extended or adjusted under 35 U.S.C. 154(b) by 547 days.

(21) Appl. No.: 18/143,661

(22) Filed: May 5, 2023

(65) Prior Publication Data

US 2023/0363226 A1 Nov. 9, 2023

Related U.S. Application Data

(60) Provisional application No. 63/339,199, filed on May 6, 2022.

(51) Int. Cl.
*H10K 59/35* (2023.01)
*G09G 3/20* (2006.01)
*G09G 3/3208* (2016.01)

(52) U.S. Cl.
CPC ......... *H10K 59/351* (2023.02); *G09G 3/2096* (2013.01); *G09G 3/3208* (2013.01); *G09G 2300/0452* (2013.01); *G09G 2320/0242* (2013.01); *G09G 2320/0666* (2013.01)

(58) Field of Classification Search
CPC ............................................ G09G 2300/0452
See application file for complete search history.

(56) References Cited

U.S. PATENT DOCUMENTS 4,769,292 A 9/1988 Tang
5,247,190 A 9/1993 Friend
5,703,436 A 12/1997 Forrest
5,707,745 A 1/1998 Forrest
5,834,893 A 11/1998 Bulovic
(Continued)

FOREIGN PATENT DOCUMENTS

CN 1689064 A 10/2005
CN 101874317 A 10/2010
(Continued)

OTHER PUBLICATIONS

Baldo et al. "Highly efficient phosphorescent emission from organic electroluminescent devices", Nature, vol. 395, pp. 151-154, 1998.
(Continued)

*Primary Examiner* — Dale E Page
(74) *Attorney, Agent, or Firm* — Butzel Long

(57) ABSTRACT

Embodiments of the disclosed subject matter provide a device that may include an emissive surface having a plurality of pixels, where each pixel has four or more sub-pixels, and where each pixel may be capable of: (a) a color rendering index (CRI) that is ga minimum of 85; and (b) a minimum color gamut equal to 85% of a color space, wherein the color space is selected from at least one of a group consisting of: DCI-3, BT.2020, and Adobe™ RGB 1998.

20 Claims, 6 Drawing Sheets

(56) References Cited

U.S. PATENT DOCUMENTS

| | | | |
|---|---|---|---|
| 5,844,363 A | 12/1998 | Gu | |
| 6,013,982 A | 1/2000 | Thompson | |
| 6,087,196 A | 7/2000 | Sturm | |
| 6,091,195 A | 7/2000 | Forrest | |
| 6,097,147 A | 8/2000 | Baldo | |
| 6,280,559 B1 | 8/2001 | Terada | |
| 6,294,398 B1 | 9/2001 | Kim | |
| 6,303,238 B1 | 10/2001 | Thompson | |
| 6,337,102 B1 | 1/2002 | Forrest | |
| 6,468,819 B1 | 10/2002 | Kim | |
| 6,537,688 B2 | 3/2003 | Silvernail | |
| 6,597,111 B2 | 7/2003 | Silvernail | |
| 6,664,137 B2 | 12/2003 | Weaver | |
| 6,835,950 B2 | 12/2004 | Brown | |
| 6,888,305 B2 | 5/2005 | Weaver | |
| 6,888,307 B2 | 5/2005 | Silvernail | |
| 6,897,474 B2 | 5/2005 | Brown | |
| 7,038,373 B2 | 5/2006 | Arnold | |
| 7,187,119 B2 | 3/2007 | Weaver | |
| 7,279,704 B2 | 10/2007 | Walters | |
| 7,431,968 B1 | 10/2008 | Shtein | |
| 7,663,300 B2 | 2/2010 | Hack | |
| 7,683,534 B2 | 3/2010 | Weaver | |
| 7,714,500 B2 | 5/2010 | Hirakata | |
| 7,968,146 B2 | 6/2011 | Wagner | |
| 7,982,385 B2 | 7/2011 | Kimura | |
| 8,040,052 B2 | 10/2011 | Kobayashi | |
| 8,084,940 B2 | 12/2011 | Kim | |
| 8,100,734 B2 | 1/2012 | Hack | |
| 8,159,426 B2 | 4/2012 | Chang | |
| 8,228,275 B2 | 7/2012 | Langendijk | |
| 8,400,018 B2 | 3/2013 | Joannopoulos | |
| 8,502,445 B2 | 8/2013 | Levermore | |
| 8,564,001 B2 | 10/2013 | Hack | |
| 8,766,531 B1 | 7/2014 | Hack | |
| 8,896,200 B2 | 11/2014 | Huang | |
| 9,331,299 B2 | 5/2016 | Xu | |
| 9,655,199 B2 | 5/2017 | Weaver | |
| 10,177,126 B2 | 1/2019 | Hack | |
| 2003/0160915 A1 | 8/2003 | Liu | |
| 2003/0178936 A1 | 9/2003 | Park | |
| 2003/0230980 A1 | 12/2003 | Forrest | |
| 2004/0061107 A1 | 4/2004 | Duggal | |
| 2004/0174116 A1 | 9/2004 | Lu | |
| 2005/0225232 A1 | 10/2005 | Boroson | |
| 2005/0242717 A1 | 11/2005 | Bae | |
| 2006/0044226 A1 | 3/2006 | Liedenbaum | |
| 2006/0238118 A1 | 10/2006 | Spindler | |
| 2006/0238120 A1 | 10/2006 | Miller | |
| 2007/0014916 A1* | 1/2007 | Daniels | B82Y 30/00 427/66 |
| 2007/0052354 A1 | 3/2007 | Chang | |
| 2007/0063946 A1* | 3/2007 | Nakamura | G02F 1/133514 345/88 |
| 2007/0205423 A1 | 9/2007 | Yamazaki | |
| 2007/0257944 A1 | 11/2007 | Miller | |
| 2007/0273295 A1 | 11/2007 | Wakabayashi | |
| 2007/0279372 A1 | 12/2007 | Brown Elliott | |
| 2008/0198180 A1 | 8/2008 | Langendijk | |
| 2008/0203905 A1 | 8/2008 | Je | |
| 2009/0051283 A1 | 2/2009 | Cok | |
| 2009/0085478 A1 | 4/2009 | Cok | |
| 2009/0091238 A1 | 4/2009 | Cok | |
| 2009/0092325 A1 | 4/2009 | Brown Elliott | |
| 2009/0102352 A1 | 4/2009 | Cok | |
| 2009/0109172 A1 | 4/2009 | Lee | |
| 2009/0121983 A1 | 5/2009 | Sung | |
| 2009/0189881 A1 | 7/2009 | Doishi | |
| 2009/0295283 A1 | 12/2009 | Kim | |
| 2010/0053043 A1 | 3/2010 | Sakamoto | |
| 2010/0090620 A1 | 4/2010 | Hack | |
| 2010/0103187 A1 | 4/2010 | Linssen | |
| 2010/0187988 A1 | 7/2010 | Forrest | |
| 2010/0219427 A1 | 9/2010 | Fukuda | |
| 2010/0231484 A1 | 9/2010 | Cok | |
| 2010/0244069 A1 | 9/2010 | Weaver | |
| 2011/0062427 A1 | 3/2011 | Jeong | |
| 2011/0095276 A1 | 4/2011 | Mai | |
| 2011/0096530 A1* | 4/2011 | Shimizu | F21K 2/08 362/231 |
| 2011/0248294 A1 | 10/2011 | Weaver | |
| 2011/0309389 A1 | 12/2011 | Yu | |
| 2012/0001207 A1 | 1/2012 | Lee | |
| 2012/0026210 A1 | 2/2012 | Yano | |
| 2012/0075278 A1 | 3/2012 | Hara | |
| 2012/0147065 A1 | 6/2012 | Byun | |
| 2012/0287605 A1 | 11/2012 | Chen | |
| 2012/0313843 A1 | 12/2012 | Kondoh | |
| 2013/0020933 A1 | 1/2013 | Levermore | |
| 2013/0082589 A1 | 4/2013 | So | |
| 2013/0105777 A1 | 5/2013 | Adamovich | |
| 2013/0105778 A1 | 5/2013 | Kim | |
| 2013/0105833 A1 | 5/2013 | Weaver | |
| 2013/0146853 A1 | 6/2013 | Lee | |
| 2013/0146904 A1 | 6/2013 | Edmond | |
| 2013/0187132 A1 | 7/2013 | Ando | |
| 2013/0235094 A1 | 9/2013 | Cok | |
| 2013/0285537 A1 | 10/2013 | Chaji | |
| 2013/0337588 A1 | 12/2013 | Lee | |
| 2014/0061595 A1 | 3/2014 | Kim | |
| 2014/0065750 A1 | 3/2014 | Harikrishna Mohan | |
| 2014/0084256 A1 | 3/2014 | Kim | |
| 2014/0111406 A1 | 4/2014 | Wang | |
| 2014/0183471 A1 | 7/2014 | Heo | |
| 2014/0291647 A1 | 10/2014 | Suzuki | |
| 2015/0009194 A1 | 1/2015 | Kim | |
| 2015/0034911 A1 | 2/2015 | Liu | |
| 2015/0138463 A1 | 5/2015 | Jinta | |
| 2017/0229663 A1 | 8/2017 | Tsai | |

FOREIGN PATENT DOCUMENTS

| | | |
|---|---|---|
| JP | 2000164347 A | 6/2000 |
| JP | 20070954444 A | 4/2007 |
| JP | 2007317915 | 12/2007 |
| JP | 2008218300 A | 9/2008 |
| JP | 2008539554 A | 11/2008 |
| JP | 2010050014 A | 3/2010 |
| JP | 2010165510 A | 7/2010 |
| JP | 2010192366 A | 9/2010 |
| JP | 2012077069 A | 4/2012 |
| JP | 2012089513 A | 5/2012 |
| JP | 2012109576 A | 6/2012 |
| JP | 2014045166 | 3/2014 |
| JP | 201459560 A | 4/2014 |
| WO | 2006115960 A1 | 11/2006 |
| WO | 2008057394 A1 | 5/2008 |
| WO | 2010011390 A2 | 1/2010 |
| WO | 2014020817 A1 | 2/2014 |

OTHER PUBLICATIONS

Baldo, et al., “Very high-efficiency green organic light-emitting devices based on electrophosphorescence”, Applied Physics Letters, Jul. 5, 1999, 4 pp., vol. 75, No. 1, American Institute of Physics, Melville, NY, USA.

Office Action dated Jul. 11, 2017 as received in JP Application No. 2014-005666.

Office Action dated Apr. 14, 2017 as received in CN Application No. 201410019395.X.

Office Action dated Feb. 14, 2017 as received in JP Application No. 2014-005666.

Notice of Allowance dated Aug. 15, 2016 as received in U.S. Appl. No. 14/243,145.

International Search Report and Written Opinion issued Nov. 10, 2015 in corresponding International Application No. PCT/US2015/032672, Nov. 10, 2015.

Hack, et al., “Novel Two Mask AMOLED Display Architecture”, SID 2014 Digest, pp. 567-569.

Wood, “MacAdam Ellipses”, Protocol, 2010, 15-18.

CN Office Action dated Dec. 13, 2017 in Application No. 201410019395.X, 5 pages.

(56) References Cited

OTHER PUBLICATIONS

Chinese Office Action dated Jun. 12, 2018 for CN Application No. 201410019395.X, 8 pages.
Chinese Office Action issued in corresponding CN Application No. 201580028268.9, dated Oct. 25, 2018, 5 pages.
Japanese Office Action (including English translation) issued in corresponding JP Application No. 2016-569684, dated Oct. 30, 2018, 9 pages.
Korean Office Action (with English language translation) for Application No. KR10-2014-0002707, dated Jun. 27, 2019, 15 pages.
Japanese Office Action (with English translation) issued in JP Application No. 2019-007571, dated Dec. 24, 2019, 9 pages.
Japanese Office Action (with English language translation) for Application No. JP2019-007571, dated Mar. 31, 2020, 7 pages.
60.3: Two-stacked White Organic Light-emitting Diodes Consisting of Fluorescent and Phosphorescent Hybrid Structure with High Efficiency and Good color Characteristics Sung-Hoon Pieh, Myung-Seop Kim, Chang-Je Sung, Jeong-Dae Seo, Hong-Seok Choi, Chang-Wook Han, Yoon-Heung Tak, Society for Information Display Digest of Technical Papers, 40, pp. 903-906 (2009).
11.1 15-inch RGBW Panel Using Two-Stacked White OLED and Color Filter for Large-Sized Display Applications Chang-Wook Han, Sung-Hoon Pieh, Hee-Suk Pang, Jae-Man Lee, Hong-Seok Choi, Soon-Kwang Hong, Bum-Sik Kim, Yoon-Heung Tak, Nam-Yang Lee, Byung-Chul Ahn, Society for Information Display Digest of Technical Papers, 41, 1, pp. 136-139 (2010).
34.1 Evaluating and Minimizing Color Distortion in Wide-Gamut Displays Due to Variations of Cone Fundamentals among Color-Normal Observers, Lorne Whitehead, Kevin A. G. Smet, Michael Webster, Society for Information Display Digest of Technical Papers, 52, 1, pp. 450 (2021).

* cited by examiner

ORGANIC ELECTROLUMINESCENT DEVICES

CROSS-REFERENCE TO RELATED APPLICATIONS

This application claims priority to U.S. Patent Application Ser. No. 63/339,199, filed May 6, 2022, the entire contents of which is incorporated herein by reference.

FIELD

The present invention relates to emissive devices including organic emissive devices with a plurality of sub-pixels that may provide illumination and display images and/or video, and techniques for fabricating the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent molecules capable of phosphorescent emission is a full color display. Industry standards for such a display call for pixels adapted to emit particular colors, referred to as "saturated" colors. In particular, these standards call for saturated red, green, and blue pixels. Alternatively, the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

Layers, materials, regions, and devices may be described herein in reference to the color of light they emit. In general, as used herein, an emissive region that is described as producing a specific color of light may include one or more emissive layers disposed over each other in a stack.

As used herein, a "red" layer, material, region, or device refers to one that emits light in the range of about 580-700 nm or having a highest peak in its emission spectrum in that region. Similarly, a "green" layer, material, region, or device refers to one that emits or has an emission spectrum with a peak wavelength in the range of about 500-600 nm; a "blue"

layer, material, or device refers to one that emits or has an emission spectrum with a peak wavelength in the range of about 400-500 nm; a "yellow" layer, material, region, or device refers to one that has an emission spectrum with a peak wavelength in the range of about 540-600 nm; a "cyan" layer, material, or device refers to one that emits or has an emission spectrum with a peak wavelength in the range of about 490-520 nm; and an "orange" layer, material, or device refers to one that emits or has an emission spectrum with a peak wavelength in the range of about 570-620 nm. In some arrangements, separate regions, layers, materials, regions, or devices may provide separate "deep blue" and a "light blue" light. As used herein, in arrangements that provide separate "light blue" and "deep blue", the "deep blue" component refers to one having a peak emission wavelength that is at least about 4 nm less than the peak emission wavelength of the "light blue" component. Typically, a "light blue" component has a peak emission wavelength in the range of about 465-500 nm, and a "deep blue" component has a peak emission wavelength in the range of about 400-470 nm, though these ranges may vary for some configurations. Similarly, a color altering layer refers to a layer that converts or modifies another color of light to light having a wavelength as specified for that color. For example, a "red" color filter refers to a filter that results in light having a wavelength in the range of about 580-700 nm. In general, there are two classes of color altering layers: color filters that modify a spectrum by removing unwanted wavelengths of light, and color changing layers that convert photons of higher energy to lower energy. A component "of a color" refers to a component that, when activated or used, produces or otherwise emits light having a particular color as previously described. For example, a "first emissive region of a first color" and a "second emissive region of a second color different than the first color" describes two emissive regions that, when activated within a device, emit two different colors as previously described.

As used herein, emissive materials, layers, and regions may be distinguished from one another and from other structures based upon the spectrum of light initially generated by the material, layer or region, as opposed to light eventually emitted by the same or a different structure. The initial light generation typically is the result of an energy level change resulting in emission of a photon. For example, an organic emissive material may initially generate blue light, which may be converted by a color filter, quantum dot or other structure to red or green light, such that a complete emissive stack or sub-pixel emits the red or green light. In this case the initial emissive material or layer may be referred to as a "blue" component, even though the sub-pixel is a "red" or "green" component.

In some cases, it may be preferable to describe the color of a component such as an emissive region, sub-pixel, color altering layer, or the like, in terms of 1931 CIE coordinates. For example, a yellow emissive material may have multiple peak emission wavelengths, one in or near an edge of the "green" region, and one within or near an edge of the "red" region as previously described. Accordingly, as used herein, each color term also corresponds to a shape in the 1931 CIE coordinate color space. The shape in 1931 CIE color space is constructed by following the locus between two color points and any additional interior points. For example, interior shape parameters for red, green, blue, and yellow may be defined as shown below:

| Color | CIE Shape Parameters |
|---|---|
| Central Red | Locus: [0.6270, 0.3725]; [0.7347, 0.2653]; Interior: [0.5086, 0.2657] |
| Central Green | Locus: [0.0326, 0.3530]; [0.3731, 0.6245]; Interior: [0.2268, 0.3321 |
| Central Blue | Locus: [0.1746, 0.0052]; [0.0326, 0.3530]; Interior: [0.2268, 0.3321] |
| Central Yellow | Locus: [0.373 1, 0.6245]; [0.6270, 0.3725]; Interior: [0.3 700, 0.4087]; [0.2886, 0.4572] |

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to an embodiment, a device may include an emissive surface having a plurality of pixels, where each pixel has four or more sub-pixels, and where each pixel may be capable of: (a) a color rendering index (CRI) that is a minimum of 85; and (b) a minimum color gamut equal to 85% of a color space, wherein the color space is selected from at least one of a group consisting of: DCI-P3, BT.2020, and Adobe™ RGB 1998.

The CRI that is a minimum of 85 may be greater than 85, greater than 90, and/or greater than 95. The minimum color gamut of 85% of the at least one selected color space may be greater than 85% of the at least one selected color space, greater than 90% of the at least one selected color space, greater than 95% of the at least one selected color space, greater than 100% of the at least one selected color space, and/or greater than 105% of the at least one selected color space.

In some embodiments, the device is capable of rendering greater than 85%, 90%, 95%, and/or 100% of an industry standard wide color gamut. As used herein, a wide color gamut may be any color gamut wider (with a larger area) than BT.709. Wide color gamuts may include DCI-P3, Adobe™ RGB, BT.2020, or others.

The emissive surface may be part of an organic light emitting device (OLED), a light emitting device (LED), and/or a quantum dot light emitting device (QLED).

At least two sub-pixels of each pixel of the device may be configured to output white light.

The device may include at least one stack having a plurality of organic light emitting devices (OLEDs), where the stack includes at least a portion of the plurality of pixels of the emissive surface. The plurality of OLEDs of the at least one stack may be separately addressable. The at least one stack may be a plurality of stacks, where each stack of the plurality of stacks is configured to emit a different color of light, and emitters in each stack are independently addressable. Each of the plurality of stacks may be disposed on top of one another.

The emissive surface of the device may include at least two emissive layers that are patterned for at least two of the sub-pixels within each pixel that is configured to produce different emission spectra. The sub-pixels of the emissive layer may be configured to render emission spectra from the device using color altering layers, quantum dots, and/or differing cavity lengths. The CRI of the emission spectra may be different for different groupings of at least a portion of the sub-pixels.

At least one of the four or more sub-pixels may be a cyan sub-pixel, a yellow sub-pixel, and/or an orange sub-pixel.

At least one of the four or more sub-pixels of the device may be a deep red sub-pixel, a deep blue sub-pixel, a light red sub-pixel, and/or a light blue sub-pixel.

The device may include a first emitting plane and a second emitting plane. The second emitting plane may be configured to be semi-transparent, may be configured to be a lower resolution than the first emitting plane, may be configured to have broad and white emission, may be configured to have passive matrix addressing, and/or may be configured to be color temperature tunable. The first emitting plane may be transparent, and the first emitting plane may be superimposed over the second emitting plane that is semi-transparent. In some embodiments, the second emitting plane is disposed adjacent to the first emitting plane.

Four or more sub-pixels of the device may include red sub-pixel, a green sub-pixel, a blue sub-pixel, and a white sub-pixel. The red sub-pixel, the green sub-pixel, the blue sub-pixel, and the white sub-pixel may be patterned sub-pixels, and the white sub-pixel may be individually patterned. The CRI may be provided by one or more of the white sub-pixel, the red sub-pixel, the green sub-pixel, and the blue sub-pixel. In an embodiment, the emissive surface of the device may be configured with the CRI to render unsaturated images. The CRI may be greater than 80, greater than 85, greater than 90, and/or greater than 95.

A blue sub-pixel and a yellow sub-pixel of the four or more sub-pixels of the device may be configured to generate white light. The four or more sub-pixels may include a red sub-pixel and a green sub-pixel.

In and embodiments, the CRI of the emissive surface of the device may be configured for object illumination with white light. The CRI may be greater than 80, greater than 85, greater than 90, and/or greater than 95.

In an embodiment, the CRI of the emissive surface of the device may be configured for an automotive display. For example, the CRI may be greater than 80, greater than 85, greater than 90, and/or greater than 95. The device may include a controller communicatively coupled to the automotive display, where the controller is configured to control the display in a first mode and a second mode, and where the controller decreases an amount of cyan, green, and yellow light emitted from the automotive display, and increases an amount of red and blue light emitted from the automotive display.

The emissive surface of the display may include a blue emitter and a yellow emitter, where at least one color altering layer is disposed over the blue emitter and the yellow emitter. The four or more sub-pixels of the device may include five sub-pixels. The full width half maximum (FWHM) of the device may be greater than 40 nm, greater than 50 nm, greater than 60 nm, and/or greater than 70 nm for light blue sub-pixels and yellow sub-pixels included in the five sub-pixels.

The device may further include a controller that is configured to adjust the CRI of the emissive surface.

The device may include a yellow sub-pixel and a light blue sub-pixel of the four or more sub-pixels of the device may have a full width half maximum (FWHM) that is greater than 40 nm, greater than 50 nm, greater than 60 nm, and/or greater than 70 nm.

A red sub-pixel, a green sub-pixel, and/or a deep blue sub-pixel of the four or more sub-pixels of the device may have a full width half maximum (FWHM) that is less than 20 nm, less than 30 nm, less than 40 nm, less than 50 nm, less than 60 nm, and/or less than 70 nm.

The four or more sub-pixels of the device may include six sub-pixels from three different organic light emitting device (OLED) depositions, and/or may include a plurality of sub-pixels of a single color primary from a single OLED deposition.

The device may include a controller that is configured to control the emissive surface as a flash source.

The device may include a yellow emissive region, a first blue emissive region, and a second blue emissive region. The four or more sub-pixels of the device may have five sub-pixels that include a red sub-pixel, a green sub-pixel, a yellow sub-pixel, a first blue sub-pixel, and a second blue sub-pixel. The first blue sub-pixel and/or the second blue sub-pixel of the device may be a light blue sub-pixel. The first blue sub-pixel and/or the second blue sub-pixel may be a deep blue sub-pixel. In some embodiments, the four or more sub-pixels of the device may have five sub-pixels that include a red sub-pixel, a first green sub-pixel, a second green sub-pixel, a yellow sub-pixel, and a blue sub-pixel. The first green sub-pixel and/or the second green sub-pixel of the device may be a light green sub-pixel. The light green sub-pixel may be configured to emit or have an emission spectrum with a peak wavelength in the range of about 525-540 nm. The first green sub-pixel and/or the second green sub-pixel may be a deep green sub-pixel. The deep green sub-pixel may be configured to emit or have an emission spectrum with a peak wavelength in the range of about 500-525 nm.

According to an embodiment, a device may include a first organic light emitting device (OLED) disposed over a second OLED device in a stack arrangement. Each pixel of the first OLED device and the second OLED device may include four or more sub-pixels. The pixel of the first OLED device and the second OLED device may be capable of: (a) a color rendering index (CRI) that is a minimum of 85; and (b) a minimum color gamut equal to 85% of a color space, wherein the color space is selected from at least one of a group consisting of: DCI-P3, BT.2020, and Adobe™ RGB 1998.

According to an embodiment, a consumer electronic device may have an emissive surface having a plurality of pixels, where each pixel has four or more sub-pixels, and where each pixel is configured to have may include an emissive surface having a plurality of pixels, where each pixel has four or more sub-pixels, and where each pixel may be capable of: (a) a color rendering index (CRI) that is a minimum of 85, and (b) a minimum color gamut equal to 85% of a color space, wherein the color space is selected from at least one of a group consisting of: DCI-P3, BT.2020, and Adobe™ RGB 1998.

The device may be a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, an automotive display, a video walls comprising multiple displays tiled together, a theater or stadium screen, and/or a sign.

According to an embodiment, a device may include an emissive surface having a plurality of pixels, where the emissive surface has a resolution that is greater than 50 DPI, greater than 100 DPI, greater than 300 DPI, and/or greater than 500 DPI, and where each pixel is capable of (a) a color rendering index (CRI) that is a minimum of 85, and (b) a minimum color gamut equal to 85% of a color space, wherein the color space is DCI-P3, BT.2020, and/or Adobe™ RGB 1998.

According to an embodiment, a device may include an emissive surface having a plurality of pixels, where each pixel has four or more sub-pixels, where at least a first sub-pixel of the four or more sub-pixels is disposed over at least a portion of at least a second sub-pixel of the four or more sub-pixels, and where each pixel is capable of: (a) a color rendering index (CRI) that is a minimum of 85, and (b) a minimum color gamut equal to 85% of a color space, where the color space is DCI-P3, BT.2020, and/or Adobe™ RGB 1998.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
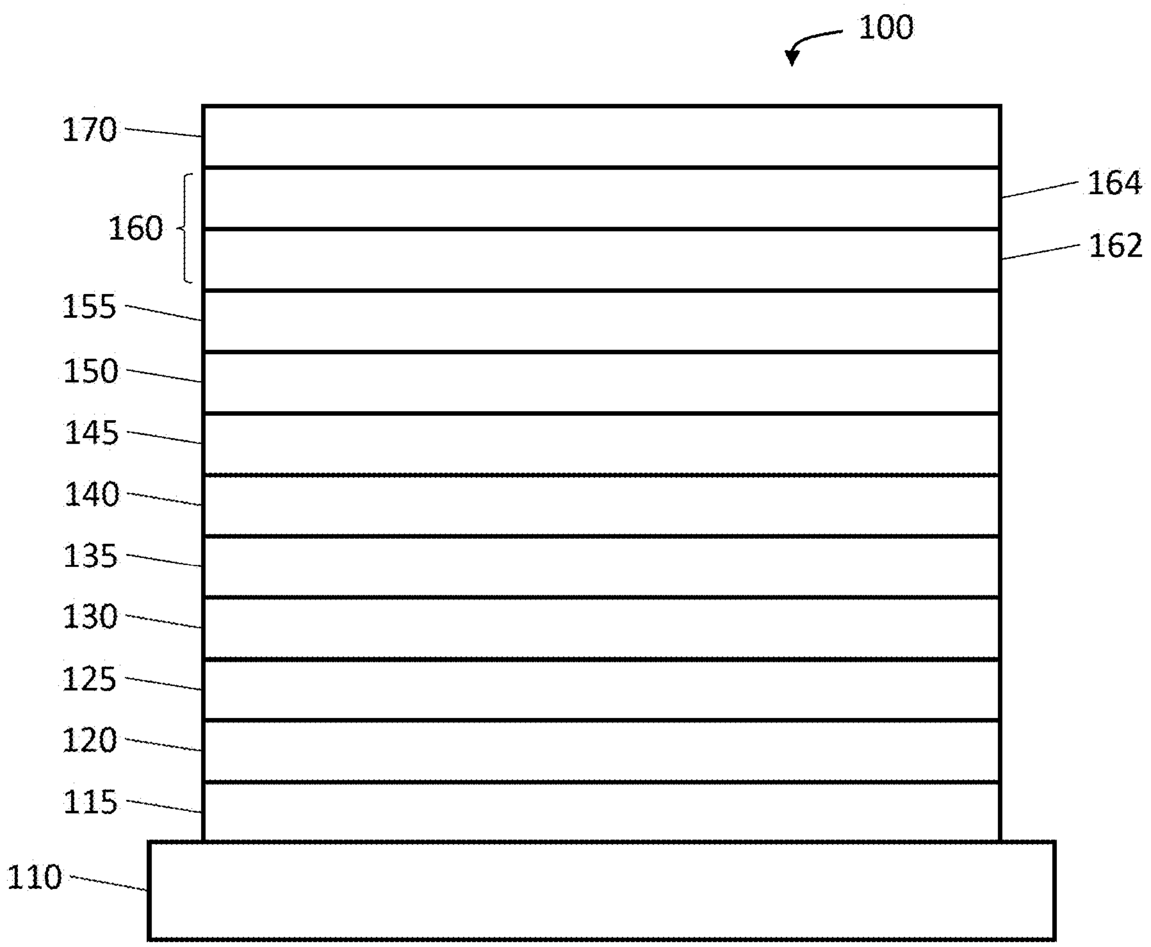
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. Barrier layer 170 may be a single- or multi-layer barrier and may cover or surround the other layers of the device. The barrier layer 170 may also surround the substrate 110, and/or it may be arranged between the substrate and the other layers of the device. The barrier also may be referred to as an encapsulant, encapsulation layer, protective layer, or permeation barrier, and typically provides protection against permeation by moisture, ambient air, and other similar materials through to the other layers of the device. Examples of barrier layer materials and structures are provided in U.S. Pat. Nos. 6,537,688, 6,597,111, 6,664,137, 6,835,950, 6,888,305, 6,888,307, 6,897,474, 7,187,119, and 7,683,534, each of which is incorporated by reference in its entirety.

Figure 2:
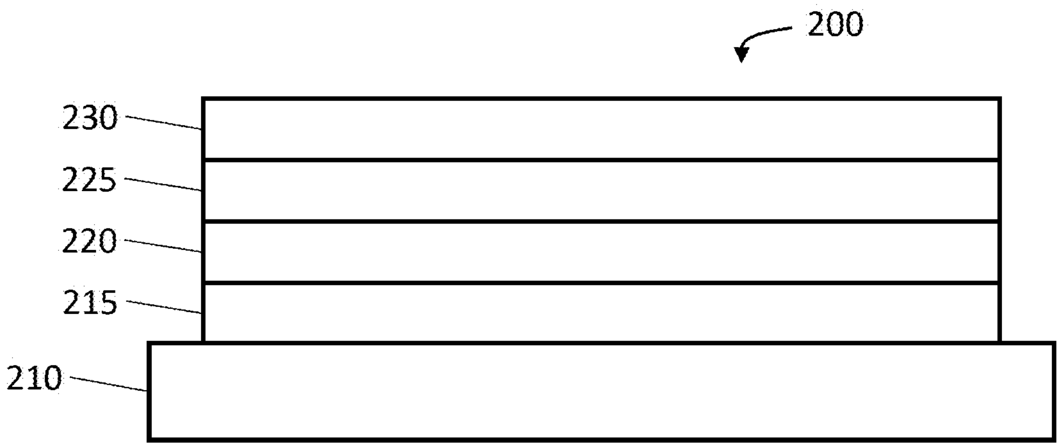
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. The emissive layer may use different emissive display technologies. Such technologies may include inorganic and/or organic devices, such as LEDs, mini LEDs, microLEDs, thin electroluminescent films, organic light emitting devices, and the like. An "emissive layer" or "emissive material" as disclosed herein may include an organic emissive material and/or an emissive material that contains quantum dots or equivalent structures, unless indicated to the contrary explicitly or by context according to the understanding of one of skill in the art. In general, an emissive layer includes emissive material within a host matrix. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light based on an injected electrical charge, where the initial light may be altered by another layer such as a color filter or other color altering layer that does not itself emit an initial light within the device, but may re-emit altered light of a different spectra content based upon absorption of the initial light emitted by the emissive layer and downconversion to a lower energy light emission. In some embodiments disclosed herein, the color altering layer, color filter, upconversion, and/or downconversion layer may be disposed outside of an OLED device, such as above or below an electrode of the OLED device.

Unless otherwise specified, any of the layers of the various embodiments may be placed, disposed, or deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. The enhancement layer is provided no more than a threshold distance away from the organic emissive layer, where the emitter material has a total non-radiative decay rate constant and a total radiative decay rate constant due to the presence of the enhancement layer and the threshold distance is where the total non-radiative decay rate constant is equal to the total radiative decay rate constant. In some embodiments, the OLED further comprises an outcoupling layer. In some embodiments, the outcoupling layer is disposed over the enhancement layer on the opposite side of the organic emissive layer. In some embodiments, the outcoupling layer is disposed on opposite side of the emissive layer from the enhancement layer but still outcouples energy from the surface plasmon mode of the enhancement layer. The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. If energy is scattered to the non-free space mode of the OLED other outcoupling schemes could be incorporated to extract that energy to free space. In some embodiments, one or more intervening layer can be disposed between the enhancement layer and the outcoupling layer. The examples for intervening layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and reduced efficiency roll-off of the OLED device. Placement of the enhancement layer on the cathode side, anode side, or on both sides results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, Ca alloys or mixtures of these materials, and stacks of these materials. In general, a metamaterial is a medium composed of different materials where the medium as a whole acts differently than the sum of its material parts. In particular, we define optically active metamaterials as materials which have both negative permittivity and negative permeability. Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors ("DBRs") in that the medium should appear uniform in the direction of propagation on the length scale of the wavelength of light. Using terminology that one skilled in the art can understand: the dielectric constant of the metamaterials in the direction of propagation can be described with the effective medium approximation. Plasmonic materials and metamaterials provide methods for controlling the propagation of light that can enhance OLED performance in a number of ways.

In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly. In some embodiments, the wavelength-sized features and the sub-wavelength-sized features have sharp edges.

In some embodiments, the outcoupling layer has wavelength-sized features that are arranged periodically, quasi-periodically, or randomly, or sub-wavelength-sized features that are arranged periodically, quasi-periodically, or randomly. In some embodiments, the outcoupling layer may be composed of a plurality of nanoparticles and in other embodiments the outcoupling layer is composed of a plurality of nanoparticles disposed over a material. In these embodiments the outcoupling may be tunable by at least one of varying a size of the plurality of nanoparticles, varying a shape of the plurality of nanoparticles, changing a material of the plurality of nanoparticles, adjusting a thickness of the material, changing the refractive index of the material or an additional layer disposed on the plurality of nanoparticles, varying a thickness of the enhancement layer, and/or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles where the metal is selected from the group consisting of Ag, Al, Au, Ir, Pt, Ni, Cu, W, Ta, Fe, Cr, Mg, Ga, Rh, Ti, Ru, Pd, In, Bi, Ca, alloys or mixtures of these materials, and stacks of these materials. The plurality of nanoparticles may have additional layer disposed over them. In some embodiments, the polarization of the emission can be tuned using the outcoupling layer. Varying the dimensionality and periodicity of the outcoupling layer can select a type of polarization that is preferentially outcoupled to air. In some embodiments the outcoupling layer also acts as an electrode of the device.

In embodiments of the disclosed subject matter, a device may include an enhancement layer that is disposed over an emissive area of at least one sub-pixel that is configured to have a Lambertian emission and/or at least one sub-pixel having a microcavity configured for direct emission, as described in detail below. In at least some of such embodiments, the enhancement layer may include a plasmonic structure that is disposed a predetermined threshold distance from the emissive area. The predetermined threshold distance may be a distance at which a total non-radiative decay rate constant is equal to a total radiative decay rate constant. In some of such embodiments, device may include an outcoupling layer is disposed over the enhancement layer on the opposite side of the emissive area.

It is believed that the internal quantum efficiency (IQE) of fluorescent OLEDs can exceed the 25% spin statistics limit through delayed fluorescence. As used herein, there are two types of delayed fluorescence, i.e., P-type delayed fluorescence and E-type delayed fluorescence. P-type delayed fluorescence is generated from triplet-triplet annihilation (TTA).

In some embodiments, a compound in an emissive material and/or layer in an OLED may be used as a phosphorescent sensitizer, where one or multiple layers in the OLED may include an acceptor in the form of one or more fluorescent and/or delayed fluorescence emitters. In some embodiments, the compound can be used as one component of an exciplex to be used as a sensitizer. As a phosphorescent sensitizer, the compound may be capable of energy transfer to the acceptor, and the acceptor may emit the energy or further transfer energy to a final emitter. The acceptor concentrations may range from 0.001% to 100%. The acceptor may be in either the same layer as the phosphorescent sensitizer or in one or more different layers. In some embodiments, the acceptor may be a TADF emitter. In some embodiments, the acceptor may be a fluorescent emitter. In some embodiments, the emission may arise from any or all of the sensitizer, acceptor, and/or final emitter.

On the other hand, E-type delayed fluorescence described above does not rely on the collision of two triplets, but rather on the thermal population between the triplet states and the singlet excited states. Compounds that are capable of generating E-type delayed fluorescence are required to have very small singlet-triplet gaps. Thermal energy can activate the transition from the triplet state back to the singlet state. This type of delayed fluorescence is also known as thermally activated delayed fluorescence (TADF). A distinctive feature of TADF is that the delayed component increases as temperature rises due to the increased thermal energy. If the reverse intersystem crossing rate is fast enough to minimize the non-radiative decay from the triplet state, the fraction of back populated singlet excited states can potentially reach 75%. The total singlet fraction can be 100%, far exceeding the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap (AES-T). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small AES-T. These states may involve CT states. Often, donor-acceptor luminescent materials are constructed by connecting an electron donor moiety such as amino- or carbazole-derivatives and an electron acceptor moiety such as N-containing six-membered aromatic ring.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, an automotive display, a video walls comprising multiple displays tiled together, a theater or stadium screen, and a sign. Various control mechanisms may be used to control devices fabricated in accordance with the present invention, including passive matrix and active matrix. Many of the devices are intended for use in a temperature range comfortable to humans, such as 18° C. to 30° C., and more preferably at room temperature (20-25° C.), but could be used outside this temperature range, for example, from −40° C. to 80° C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer having carbon nanotubes.

In some embodiments, the OLED further comprises a layer having a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound causing light to be generated can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes, including phosphor sensitized fluorescence.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used may be a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

Displays are typically optimized to render a still image or video image, typically having three primary colors (red, green, and blue (RGB)) as sub-pixels at a given brightness as viewed directly by the user. A fourth white sub-pixel is sometimes used in a display. The color 'quality' (or color rendering index-CRI), which may be determined by rendered reflections off the surfaces surrounding a display, is not typically considered an important design criteria or specification as it would be when designing a lighting source. Therefore, the optimal emission spectra from the sub-pixels in a display may be very different to the optimal characteristics of a light source. Displays typically have discrete red, green, and blue (RGB) sub-pixels. A trend in display architectures is to increase the display color gamut, which uses narrower emission spectra from the sub-pixels. Lighting sources use broad emission sources that more closely resemble black body radiators (i.e., an emission spectrum found in the natural world) to have optimal spectral characteristics. Generally, displays having high color gamuts render high CRI white light poorly compared to displays with lower color gamuts.

As displays become larger, more ubiquitous, and cover multiple surfaces throughout domestic and office environments, the importance of color rendering of images in such displays and providing lighting in those environments may increase. For example, a flat panel display may be a source of illumination for one or more objects in a domestic or office environment. In this example, it may be desirable to have a high color gamut flat panel display that can accurately render images, and also provide high quality, high CRI lighting for use by the display user(s) or other individuals. Embodiments of the disclosed subject matter provide devices that include seemingly disparate specifications for display and lighting sources and enable a device capable of fulfilling both tasks.

Figure 3:
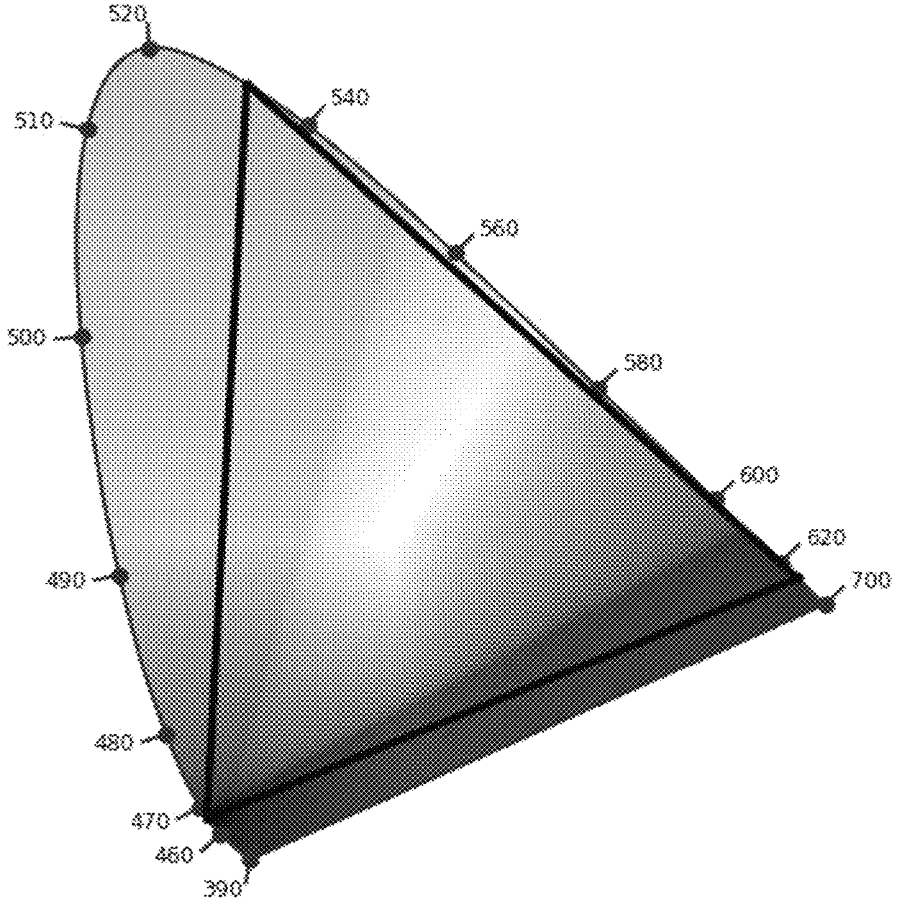
FIG. 3 shows an example color gamut defined by primary points of three different colors, and polygons based on the primary points.

To simultaneously enable a wide color gamut for display purposes and good color rendering index for lighting purposes, embodiments of the disclosed subject matter provide display devices that use four or more sub-pixels in each pixel of the display. In some embodiments, one or more sub-pixels may be used in addition to the more traditional RGB colors. Such additional sub-pixels may be found on the edges of the CIE color space diagram, such as shown in FIG. 3. For example, a cyan, yellow and/or orange sub-pixels may be included in each pixel of a display. In some embodiments, the additional sub-pixels may be less saturated (e.g., by lack of filtering or cavity effects) version of the primary sub-pixels (e.g., the red, green, and blue sub-pixels).

CRI is a measure of light quality as it relates to illumination of objects of different colors. The method for calculating a CRI value for a particular light source involves illuminating, or simulating illumination, of a series of test samples (named TCS01 through TCS08) with the light source in question and comparing the reflected light color to that of a standard illuminant (either a blackbody or D65 white). A higher CRI value is indicative of a better quality light source capable of more accurately depicting colors of objects being illuminated. To achieve a high CRI from a pixel or plurality of pixels, it is desirable to match the spectrally broad emission of a blackbody radiator. Therefore, more broad emission spectra or a greater number of emitters is needed. In particular, this is true in the yellow region of the visible spectrum.

Color gamuts are typically industry standard areas within a given color space (for instance, CIE 1931 color space) which are generally defined by three color primary points. BT.2020 is an increasingly widely adopted color gamut which, in CIE1 931 color space, has primary x and y coordinates of:

| | |
|---|---|
| Red | 0.708, 0.292 |
| Green | 0.170, 0.797 |
| Blue | 0.131, 0.046 |

For a given pixel, or plurality of pixels, color gamut percentage may be defined as the ratio of the area of the color space within the polygon describe by subpixel primaries to the area of the color gamut polygon. An example color gamut and polygons are shown in FIG. 3. The area of the color space within the subpixel primaries can be defined two different ways: (1) the total area of the polygon, or (2) just the area which overlaps the color gamut in question. Embodiments of the disclosed subject matter may have an area of the color space defined by the total area of the polygon.

To provide a display device with pixels to provide illumination as well as display images and/or video, the features of high CRI (typically broad spectra) and wide color gamut (typically narrow spectra) are at odds. Embodiments of the disclosed subject matter may provide both features by the selection of a number and spectral lineshape of sub-pixels. For example, a four sub-pixel configuration may be used, where three sub-pixels may be narrow band primaries to provide the wide color gamut, and one sub-pixel may have a broadband yellow, cyan, or white spectrum to provide the desired CRI. In another example, the pixels of a display may have a six sub-pixel configuration, where each primary color (R, G, B) may have a broadband (either unfiltered, or non-cavity-enhanced) sub-pixel and a narrowband (filtered or cavity-enhanced) sub-pixel. The appropriate combination of sub-pixel colors and spectra with the above configurations, among others, may provide the desired CRI and color gamut. In some embodiments, the device may be capable of rendering greater than 85%, 90%, 95%, or 100% of an industry standard wide color gamut. As used herein, a wide color gamut is any color gamut wider (with a larger area) than BT.709. Wide color gamuts may include DCI-P3, Adobe™ RGB, BT.2020, or others.

Display arrangements having four or more sub-pixels are usually avoided by display manufactures, as this increases manufacturing complexity and may potentially reduce the display resolution. Embodiments of the present invention mitigate these issues by using one or more different approaches. In some embodiments, one display arrangement may have less than one deep blue sub-pixel per pixel. This can be accommodated due to the lower spatial resolution of the eye to deep blue light and the use of more frequent 'light blue' sub-pixels. In some embodiments, a tandem or stacked display may be used, where the color emitted from each stack may be different from the stack above or below (e.g., a z-plane of the display, which may be the plane that is perpendicular to a substrate that the pixels are disposed on). In some embodiments, the emitters in each stack may be independently addressable.

In some embodiments of the disclosed subject matter, for each emitter material pattered onto the display surface, a different emission spectrum may be rendered from different sub-pixels in the display via independent patterning of the layers around the emissive layer to change the cavity length observed by the emitters. In some embodiments, color conversion layers may be separately patterned over and/or under the emitter layers. The color conversion layers may include color filters, quantum dots, and the like.

In some embodiments of the disclosed subject matter, two display planes may be superimposed, where one of the display planes may be transparent or semi-transparent. In some embodiments, the second emitting plane is disposed adjacent to the first emitting plane.

In some embodiments, the display may include patterned red, green, blue, and white sub-pixels, (RGBW), where the RGB sub-pixels are not filtered from the white (W) sub-pixel. This arrangement may provide a CRI of a predetermined amount for W sub-pixels without efficiency loss in the RGB sub-pixels.

In some embodiments, there may be limits for CRI within a color gamut range. For example, the CRI may be greater than 70 for all points within a color space covering at least 50% of DCI-P3 in 1931 CIE space. In 2005, Digital Cinema Initiatives, LCC in Hollywood, California released the Digital Cinema System Specification version 1.0, which defined the colorimetry of what would become known as the DCI-P3 color space.

In some embodiments of the disclosed subject matter, yellow and blue emissive layers may be patterned to generate white light. In an embodiment, the yellow emissive layer may have broad emission to act as a lighting source, and highly saturated red and green colors may be made from the yellow emissive layer using color altering layers. Such an arrangement may be a RGBY (red, green, blue, and yellow) four sub-pixel display.

In some embodiments, devices may have emissive regions with yellow and two different blue sub-pixels (YB1B2), formed from a yellow sub-pixel (Y), a light blue sub-pixel (B1), and a deep blue sub-pixel (B2). For example, devices may have pixels with five sub-pixels (e.g., with red, green, yellow, light blue, and deep blue (RGYB1B2). In the five sub-pixel arrangement, light blue (B1) may be used for some, most, or all images, rather than use both light blue (B1) and deep blue (B2) sub-pixels. A display using this arrangement may produce broad yellow and broad light blue light for high CRI lighting, and may produce deep saturated red, green, and blue light (RGB) to display images and/or video. The blue light may be emitted from the light blue sub-pixel (B1), or from the deep blue sub-pixel (B2), or from the light blue sub-pixel (B1) and the deep blue sub-pixel (B2). The use of yellow and blue sub-pixels may provide an efficient display. In some embodiments, the display device may include a light blue OLED deposition with a cavity or other structure to produce deep blue light. In this arrangement, two OLED depositions may be used, with one deposition configured to output broadband yellow light and another deposition configured to output broadband light blue light. Such a device may have five sub-pixels in each pixel, which may include the yellow and light blue sub-pixels, as well as three saturated RGB sub-pixels. In some embodiments, devices may include one or more infrared sub-pixels. The infrared sub-pixels may be configured to emit or have an emission spectrum with a peak wavelength in the range of about 800-1000 nm.

In some embodiments, a display may have six sub-pixels per pixel, where there may be two scan lines and three data lines per pixel. An additional color may be enabled by using color altering layers to change the output from the one or more emissive layers.

In some embodiments of the disclosed subject matter, a device may include an emissive surface having a plurality of pixels. The emissive surface may be configured to render images and/or video (e.g., images and/or video having a resolution of greater than 1 DPI (dots per inch), greater than 10 DPI, greater than 50 DPI, greater than 100 DPI, greater than 300 DPI, and/or greater than 500 DPI). The emissive surface may be configured to render high resolution images and/or video having a resolution of 300 DPI or higher. The emissive surface may be part of an organic light emitting device (OLED), an inorganic light emitting device (LED), and/or a quantum dot light emitting device (QLED). Each pixel of the plurality of pixel may have four or more sub-pixels. Each pixel may be capable of: (a) a color rendering index (CRI) that is a minimum of 85; and (b) a minimum color gamut equal to 85% of a color space, wherein the color space is selected from at least one of a group consisting of: DCI-P3, BT.2020, and Adobe™ RGB 1998.

In some embodiments, the CRI of the device that is a minimum of 85 may be greater than 85, greater than 90, and/or greater than 95. In some embodiments, the minimum color gamut of 85% of the at least one selected color space of the device may be greater than 85% of the at least one selected color space, greater than 90% of the at least one selected color space, greater than 95% of the at least one selected color space, greater than 100% of the at least one selected color space, and/or greater than 105% of the at least one selected color space.

ITU-R Recommendation BT.2020, more commonly known by the abbreviations Rec. 2020 or BT.2020, defines various aspects of ultra-high-definition television (UHDTV) with standard dynamic range (SDR) and wide color gamut (WCG), including picture resolutions, frame rates with progressive scan, bit depths, color primaries, RGB and luma-chroma color representations, chroma sub samplings, and an opto-electronic transfer function. The first version of Rec. 2020 was posted on the International Telecommunication Union (ITU) website on Aug. 23, 2012, and further editions have been published since then. Rec. 2020 is extended for high-dynamic-range (HDR) by Rec. 2100, which uses the same color primaries as Rec. 2020.

Figure 4:
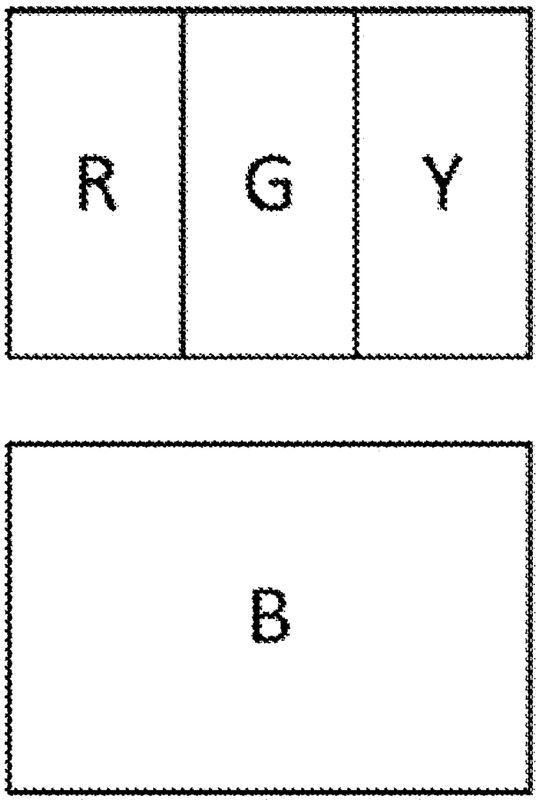
FIGS. 4-5 show example arrangements having four sub-pixels according to embodiments of the disclosed subject matter.
Figure 5:
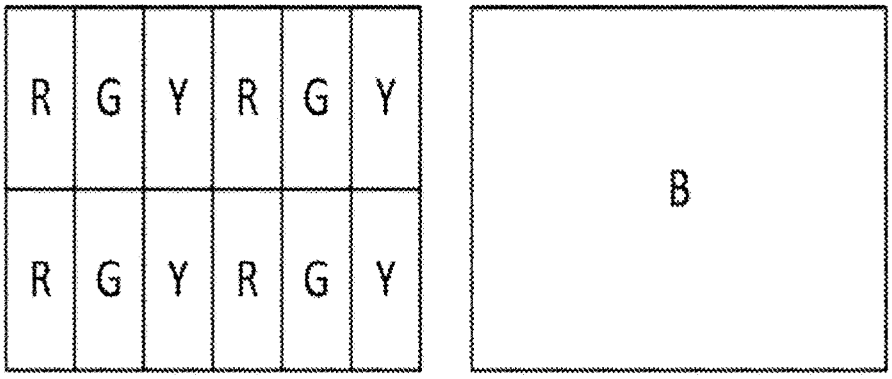

FIGS. 4-5 show example embodiments having a four sub-pixel arrangement according to embodiments of the disclosed subject matter. FIG. 4 shows an example arrangement in which yellow ("Y") sub-pixels may be located in a separate plane with respect to the substrate and blue ("B") sub-pixels. In this configuration, either the yellow (Y) sub-pixels or blue (B) sub-pixels may be substantially transparent. Red and green color altering layers then may be superposed over at least a portion of each of the yellow sub-pixels to render a device that may output red and/or green light. The example arrangement such as shown in FIG. 4 may have several advantages over a side-by-side pixel arrangement. For example, it may allow the fill factor of blue sub-pixels to be maximized to increase their lifetime. The blue sub-pixels may also be microcavities, such as top-emission (TE) OLEDs combined with a substantially Lambertian emission yellow (Y) sub-pixel plane. Such a configuration may allow the blue spectrum to be manipulated for color saturation and efficiency, while minimizing the negative angular dependence issues associated with a full color display where all the sub-pixels are top-emitting, i.e., color shift and image distortions that occur as a function of angle. For a given resolution, the lifetime of yellow sub-pixels, including the red and green color-altered sub-pixels, also may be enhanced as the aperture ratio for these pixels may be higher since there are only three sub-pixels per plane instead of four. The ratio of yellow, red, or green sub-pixels to blue also may be greater than 1, i.e., there may be more than 1 yellow, red, or green sub-pixel for each blue. An example of such a configuration is shown in FIG. 5, in which there are multiple yellow, red, and green sub-pixels in each pixel that includes a single blue sub-pixel.

The display resolution will then be determined by the Y(RG) (i.e., yellow emissive region with red and green color altering layer) sub-pixels. Such a configuration may be used for full-color OLED displays and similar devices, because the human eye typically has relatively poor spatial resolution in the blue region of the spectrum and thus is relatively insensitive to the luminance of the blue sub-pixel. Although FIG. 5 illustrates a configuration in which the blue sub-pixel has the same area as the combined Y(RG) sub-pixels, it will be understood that other configurations may be used in which the blue and yellow emissive regions, and/or the blue, red, and green sub-pixels, have different relative sizes.

The two planes of OLED sub-pixels may be constructed in a variety of ways. For example, in the Y(RG) B display, the Y(RG) sub pixels and B sub-pixels may be fabricated on separate backplanes and then attached together, with one of the backplanes being substantially transparent. Alternatively, the OLED planes may be fabricated on top of one another over one backplane.

In another example, OLEDs may be fabricated on two different planes by having the blue sub-pixel be approximately the same size as the yellow sub-pixel on the second plane, so that blue light from the first plane is not lost and absorbed by the red and green color filters of the second plane. This will still result in higher fill factor displays than putting all four colors in one plane. As red and green are only required to make highly saturated colors, these sub-pixels typically can be relatively small compared to the yellow and blue sub-pixel areas. The embodiments shown in FIGS. 4-5 are merely examples of four sub-pixel arrangements, and additional sub-pixel arrangements may be used.

The device may include at least one stack having a plurality of organic light emitting devices (OLEDs). In this embodiment, the stack may be a first arrangement of OLEDs disposed over a second arrangement of OLEDs. The stack may include at least a portion of the plurality of pixels of the emissive surface. The OLEDs of the stack may be separately addressable. In some embodiments, a device may have a plurality of stacks, and each stack may be disposed on top of one another. Each stack of the plurality of stacks may be configured to emit a different color of light, and emitters in each stack may be independently addressable.

As used herein, a sub-pixel may be an individually addressable emissive device disposed within a display pixel. The pixel configuration may be repeated over a display area. In some embodiments, a pixel may be configured with all sub-pixels adjacent to each other. In some embodiments, a pixel may be configured with one or more of the sub-pixels stacked but individually addressable, such that one or more sub-pixels emit light through another sub-pixel.

In some embodiments, the emissive surface of a device may include at least two emissive layers that are patterned for at least two of the sub-pixels within each pixel that is configured to produce different emission spectra. The sub-pixels of the emissive surface may be configured to render emission spectra from the device using color altering layers, quantum dots, and/or differing cavity lengths. The cavity length may be the distance between reflective electrodes, such as in an OLED device. The CRI of the emission spectra may be different for different groupings of at least a portion of the sub-pixels.

In some embodiments of the disclosed subject matter, the device may include a first emitting plane and a second emitting plane. For example, the first plane may be a high-resolution plane with sub-pixel colors configured to render a high resolution full-color video. The second emitting plane may have different configurations. For example, the second emitting plane may be semi-transparent. In some embodiments, the second emitting plane may have a lower resolution than the first emitting plane, may be configured to have broad and white emission, may be configured to have passive matrix addressing (i.e., without active matrix addressing), and/or may be configured to be color temperature tunable. In some embodiments, the first emitting plane may be transparent, and the first emitting plane may be superimposed over the second emitting plane that may be semi-transparent. The transparent first emitting plane may allow at least 80% or more of visible light to pass through, and the semi-transparent second emitting plane may allow between 5% less than 80% of visible light to pass through. In an embodiment, the transparent first emitting plane may allow 50-80% of visible light to pass through. In another embodiment, the transparent first emitting plane may allow 50-99% of visible light to pass through.

The device may have different sub-pixel arrangements. In some embodiments, at least two sub-pixels of each pixel of the device may be configured to output white light. In some embodiments, at least two sub-pixels of each pixel of the device may be required in combination to output white light. In some embodiments, the emissive layers of at least two sub-pixels of each pixel of the device may be configured to output white light. In some embodiments, the emissive layers of at least two sub-pixels of each pixel of the device may be required in combination to output white light. In some embodiments of the disclosed subject matter, at least one of the four or more sub-pixels may be a cyan sub-pixel, a yellow sub-pixel, and/or an orange sub-pixel. In some embodiments, at least one of the four or more sub-pixels of the device may be a deep red sub-pixel, a deep blue sub-pixel, a light red sub-pixel, and/or a light blue sub-pixel.

In some embodiments, the four or more sub-pixels of the device may include a red sub-pixel, a green sub-pixel, a blue sub-pixel, and a white sub-pixel. The red sub-pixel, the green sub-pixel, the blue sub-pixel, and the white sub-pixel may be patterned sub-pixels, and the white sub-pixel may be individually patterned. The CRI may be provided by one or more of the white sub-pixel, the red sub-pixel, the green sub-pixel, and the blue sub-pixel. The emissive surface of the device may be configured with the CRI to render unsaturated images. For example, unsaturated images may have a limited color gamut, such as 50% DCI-P3. Generally, the higher the saturation of a color, the more vivid it is, and the lower the saturation of a color, the closer it is to gray.

In some embodiments, a blue sub-pixel and a yellow sub-pixel of the four or more sub-pixels of the device may be configured to generate white light. The four or more sub-pixels may include a red sub-pixel and a green sub-pixel. For example, in a four sub-pixel arrangement, there may be a red (R) sub-pixel, a green (G) sub-pixel, a blue (B) sub-pixel, and a yellow (Y) sub-pixel (RGBY).

The emissive surface of the display may include a blue emitter and a yellow emitter, where at least one color altering layer is disposed over the blue emitter and the yellow emitter. The four or more sub-pixels of the device may include five sub-pixels. For example, the five sub-pixel arrangement may be configured to achieve a deep saturated RGB image and/or video. In some embodiments, the full width half maximum (FWHM) of the device may be greater than 40 nm, greater than 50 nm, greater than 60 nm, and/or greater than 70 nm for light blue sub-pixels and yellow sub-pixels included in the five sub-pixels.

The device may include a yellow sub-pixel and a light blue sub-pixel of the four or more sub-pixels of the device may have a full width half maximum (FWHM) that is greater than 40 nm, greater than 50 nm, greater than 60 nm, and/or greater than 70 nm. In some embodiments, a red sub-pixel, a green sub-pixel, and/or a deep blue sub-pixel of the four or more sub-pixels of the device may have a full width half maximum (FWHM) that is less than 20 nm, less than 30 nm, less than 40 nm, less than 50 nm, less than 60 nm, and/or less than 70 nm.

In some embodiments, the four or more sub-pixels of the device may include six sub-pixels from three different organic light emitting device (OLED) depositions, and/or may include a plurality of sub-pixels of a single color primary from a single OLED deposition.

In some embodiments, the CRI of the emissive surface of the device may be configured for object illumination with white light. For example, one or more pixels of the display may be configured as a flash and/or a point source of light. The device may include a controller that is configured to control the emissive surface as a flash source.

The CRI of the emissive surface of the device may be configured for an automotive display in some embodiments. The device may include a controller communicatively coupled to the automotive display, where the controller is configured to control the display in a first mode and a second mode. For example, the first mode may be a daytime mode for the display, where the display is configured to display images with daylight. In an embodiment, the second mode may be a night mode, where the display is configured to display images when minimal ambient light (e.g., daylight) is available. For example, the controller may decrease an amount of cyan, green, and yellow light emitted from the automotive display during the second (night) mode and increases an amount of red and blue light emitted from the automotive display.

The device may further include a controller that is configured to adjust the CRI of the emissive surface. For example, in basic low power consumption lighting, the light output by the device may be formed from broad yellow and blue light. For high CRI applications (e.g., high R9 or R15 applications), saturated colors from RGB sub-pixels may be added to the light output from the light blue and yellow subpixels.

The device may include a yellow emissive region, a first blue emissive region, and a second blue emissive region. The four or more sub-pixels of the device may have five sub-pixels that include a red sub-pixel, a green sub-pixel, a yellow sub-pixel, a first blue sub-pixel, and a second blue sub-pixel. The first blue sub-pixel and/or the second blue sub-pixel of the device may be a light blue sub-pixel. The first blue sub-pixel and/or the second blue sub-pixel may be a deep blue sub-pixel. In some embodiments, the four or more sub-pixels of the device may have five sub-pixels that include a red sub-pixel, a first green sub-pixel, a second green sub-pixel, a yellow sub-pixel, and a blue sub-pixel. The first green sub-pixel and/or the second green sub-pixel of the device may be a light green sub-pixel. The light green sub-pixel may be configured to emit or have an emission spectrum with a peak wavelength in the range of about 525-540 nm. The first green sub-pixel and/or the second green sub-pixel may be a deep green sub-pixel. The deep green sub-pixel may be configured to emit or have an emission spectrum with a peak wavelength in the range of about 500-525 nm.

Figure 6:
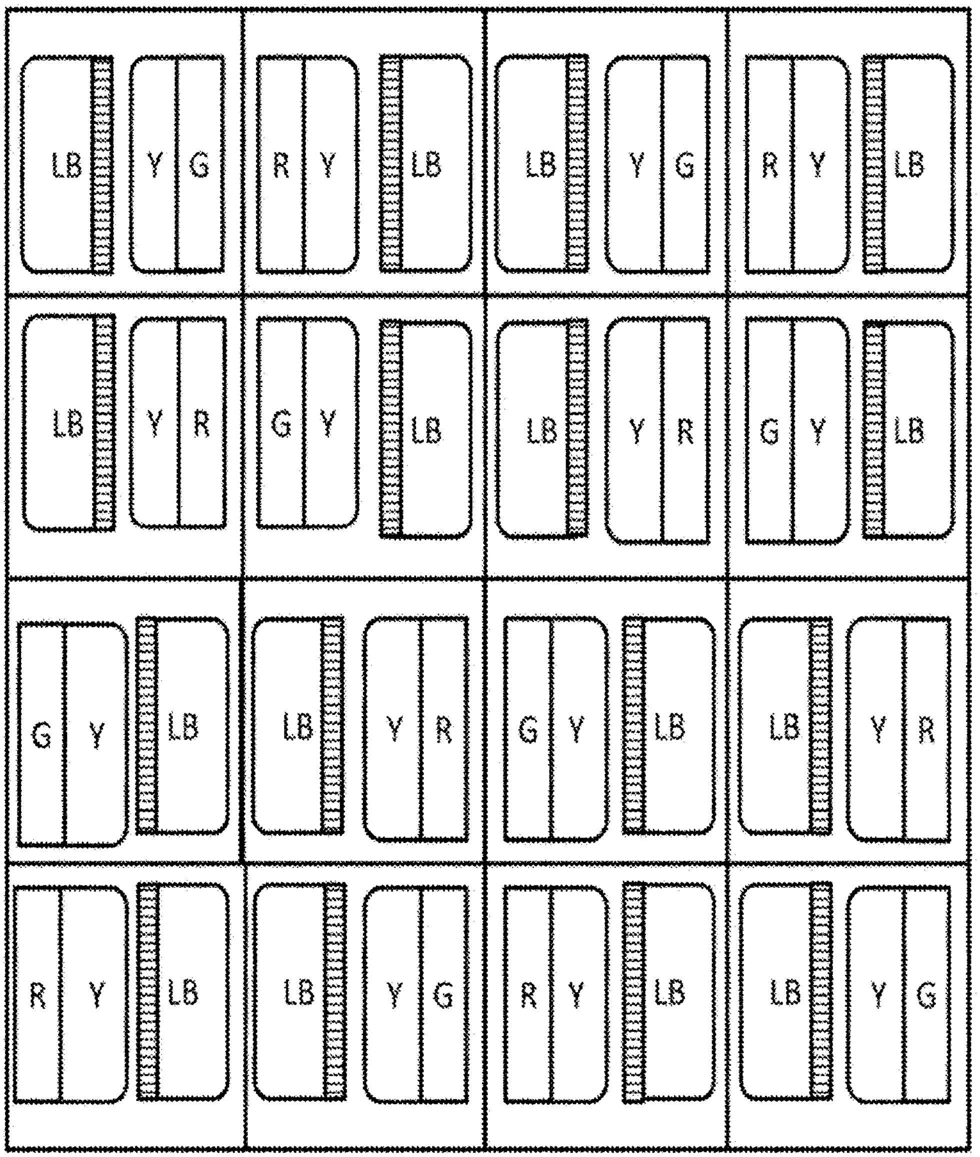
FIGS. 6-7 show example arrangements having five sub-pixels according to embodiments of the disclosed subject matter.
Figure 7:
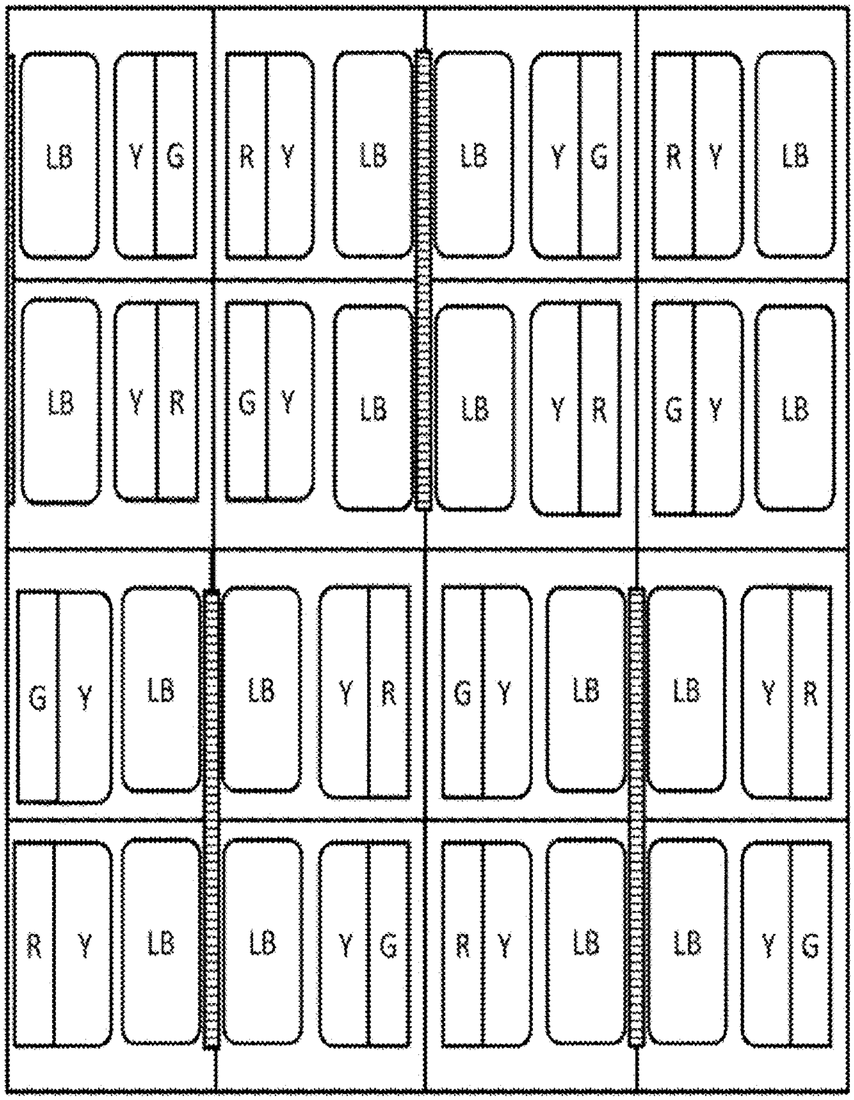

FIGS. 6-7 show example embodiments having a five sub-pixel arrangement according to embodiments of the disclosed subject matter. FIG. 6 shows an example architecture having red (R), green (G), deep blue (DB), light blue (LB), and yellow (Y) sub-pixels. For example, deep blue sub-pixels may be fabricated with a color altering layer or a microcavity that is disposed in a stack with a portion of each light blue emissive region, as shown by the horizontal hashing in FIG. 6. Such an arrangement may have two different OLED stack depositions, and may use a mask having half the resolution of the final display. The arrangement shown in FIG. 6 may provide improved lifetime relative to conventional RGB displays, while having similar power requirements to conventional RGB displays. In some embodiments, such an arrangement may only use a long-lifetime light blue emissive region, by using a color altering layer or microcavity to achieve deep blue sub-pixels, which typically is used for only a small fraction of the time of the light-blue sub-pixels.

FIG. 7 shows an example variant of FIG. 6, in which four of the deep blue sub-pixels are replaced with a single deep blue sub-pixel to be shared by four pixels. This reduces the number of driving lines and TFT circuits per pixel from 4.0 to 3.25. The deep blue (DB) sub-pixels may be formed in what are non-emissive areas in FIG. 6, which may not reduce the light blue aperture ratio and thus adversely impact its lifetime. In this configuration, the deep blue sub-pixel may use the same light blue OLED deposition as the four neighboring light blue sub-pixels, but with an independently addressable anode. As previously described, the final deep blue emission may be achieved by using a color altering layer and/or a microcavity disposed over the light blue emissive material. The embodiments shown in FIGS. 6-7 are merely example five sub-pixel arrangements, and additional sub-pixel arrangements may be used.

In some embodiments, a device may include a first organic light emitting device (OLED) disposed over a second OLED device in a stack arrangement. Each pixel of the first OLED device and the second OLED device may include four or more sub-pixels. The pixel of the first OLED device and the second OLED device may be capable of: (a) a color rendering index (CRI) that is; and (b) a minimum color gamut equal to 85% of a color space, wherein the color space is selected from at least one of a group consisting of: DCI-P3, BT.2020, and Adobe™ RGB 1998.

In some embodiments, a device may include an emissive surface having a plurality of pixels, where the emissive surface has a resolution that is greater than 50 DPI, greater than 100 DPI, greater than 300 DPI, and/or greater than 500 DPI, and where each pixel is capable of (a) a color rendering index (CRI) that is a minimum of 85, and (b) a minimum color gamut equal to 85% of a color space, wherein the color space is DCI-P3, BT.2020, and/or Adobe™ RGB 1998.

In some embodiments, a device may include an emissive surface having a plurality of pixels, where each pixel has four or more sub-pixels, where at least a first sub-pixel of the four or more sub-pixels is disposed over at least a portion of at least a second sub-pixel of the four or more sub-pixels, and where each pixel is capable of: (a) a color rendering index (CRI) that is a minimum of 85, and (b) a minimum color gamut equal to 85% of a color space, where the color space is DCI-P3, BT.2020, and/or Adobe™ RGB 1998. For example, a first sub-pixel may be disposed over at least part of a second sub-pixel, a third sub-pixel, and/or a fourth sub-pixel in a four sub-pixel arrangement. In another example, a first sub-pixel and a second sub-pixel may be disposed over at least a portion of a third sub-pixel and/or a fourth sub-pixel. In another example, at least a portion of a first sub-pixel, a second sub-pixel, and/or a third sub-pixel may be disposed over at least a portion of a fourth sub-pixel. Similar arrangements may be formed using five or more sub-pixels.

A device of one or more of the disclose embodiments may be a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, an automotive display, a video walls comprising multiple displays tiled together, a theater or stadium screen, and/or a sign.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A device comprising:

an emissive surface having a plurality of pixels, wherein each pixel has four or more sub-pixels, and wherein each pixel is capable of:

(a) a color rendering index (CRI) that is a minimum of 85, and (b) a minimum color gamut equal to 85% of a color space, wherein the color space is selected from at least one of a group consisting of: DCI-P3, BT.2020, and Adobe™ RGB 1998.

2. The device of claim 1, wherein the CRI that is a minimum of 85 is at least one selected from a group consisting of: greater than 85, greater than 90, and greater than 95.

3. The device of claim 1, wherein the minimum color gamut of 85% of the at least one selected color space is at least one selected from a group consisting of: greater than 85% of the at least one selected color space, greater than 90% of the at least one selected color space, greater than 95% of the at least one selected color space, greater than 100% of the at least one selected color space, and greater than 105% of the at least one selected color space.

4. The device of claim 1, wherein the emissive surface is part of at least one selected from the group consisting of: an organic light emitting device (OLED), an inorganic light emitting device (LED), and a quantum dot light emitting device (QLED).

5. The device of claim 1, wherein at least two sub-pixels of each pixel are required to output white light.

6. The device of claim 1, wherein at least one of the four or more sub-pixels is selected from the group consisting of: a cyan sub-pixel, a yellow sub-pixel, and an orange sub-pixel.

7. The device of claim 1, wherein at least one of the four or more sub-pixels is selected from the group consisting of: a deep red sub-pixel, a deep blue sub-pixel, a light red sub-pixel, and a light blue sub-pixel.

8. The device of claim 1, wherein the four or more sub-pixels comprise a red sub-pixel, a green sub-pixel, a blue sub-pixel, and a white sub-pixel.

9. The device of claim 8, wherein the red sub-pixel, the green sub-pixel, the blue sub-pixel, and the white sub-pixel are patterned sub-pixels, and wherein the white sub-pixel is individually patterned.

10. The device of claim 9, wherein the emissive surface is configured with high CRI to render unsaturated images, wherein the CRI is selected from a group consisting of: greater than 80, greater than 85, greater than 90, and greater than 95.

11. The device of claim 1, wherein a blue sub-pixel and a yellow sub-pixel of the four or more sub-pixels are configured to generate white light.

12. The device of claim 11, wherein the four or more sub-pixels include a red sub-pixel and a green sub-pixel.

13. The device of claim 1, wherein the CRI of the emissive surface is configured for object illumination with white light.

14. The device of claim 1, wherein the CRI of the emissive surface is configured for an automotive display.

15. The device of claim 14, further comprising:

a controller communicatively coupled to the automotive display, wherein the controller is configured to control the display in a first mode and a second mode, wherein the controller decreases an amount of cyan, green, and yellow light emitted from the automotive display, and increases an amount of red and blue light emitted from the automotive display.

16. The device of claim 1, wherein the emissive surface comprises a blue emitter and a yellow emitter, wherein at least one color altering layer is disposed over the blue emitter and the yellow emitter.

17. The device of claim 16, wherein the four or more sub-pixels comprises five sub-pixels.

18. A consumer electronic device comprising:

an emissive surface having a plurality of pixels, wherein each pixel has four or more sub-pixels, and wherein each pixel is capable of:

(a) a color rendering index (CRI) that is a minimum of 85, and (b) a minimum color gamut equal to 85% of a color space, wherein the color space is selected from at least one of a group consisting of: DCI-P3, BT.2020, and Adobe™ RGB 1998.

19. The consumer electronic device of claim 18, wherein the device is at least one type selected from the group consisting of: a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, an automotive display, a video walls comprising multiple displays tiled together, a theater or stadium screen, and a sign.

20. A device comprising:

an emissive surface having a plurality of pixels, wherein each pixel has four or more sub-pixels, wherein at least a first sub-pixel of the four or more sub-pixels is disposed over at least a portion of at least a second sub-pixel of the four or more sub-pixels, and wherein each pixel is capable of:

(a) a color rendering index (CRI) that is a minimum of 85, and (b) a minimum color gamut equal to 85% of a color space, wherein the color space is selected from at least one of a group consisting of: DCI-P3, BT.2020, and Adobe™ RGB 1998.

* * * * *